(12) United States Patent
Cheng et al.

(10) Patent No.: US 7,560,784 B2
(45) Date of Patent: Jul. 14, 2009

(54) FIN PIN DIODE

(75) Inventors: Kangguo Cheng, Beacon, NY (US); Louis Lu-Chen Hsu, Fishkill, NY (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 11/669,970

(22) Filed: Feb. 1, 2007

(65) Prior Publication Data

US 2008/0185691 A1    Aug. 7, 2008

(51) Int. Cl.
*H01L 29/76* (2006.01)
(52) U.S. Cl. .................................. 257/401; 438/164
(58) Field of Classification Search ................ 257/331, 257/365, 401, E21.703, E29.275, E29.137; 438/156, 157, 164, 192, 206, 207, 209
See application file for complete search history.

(56) References Cited

U.S. PATENT DOCUMENTS

| | | | |
|---|---|---|---|
| 6,177,289 B1 | 1/2001 | Crow et al. | |
| 6,451,702 B1 | 9/2002 | Yang et al. | |
| 6,538,299 B1 | 3/2003 | Kwark et al. | |
| 6,720,595 B2 | 4/2004 | Clevenger et al. | |
| 6,835,967 B2 | 12/2004 | Yeo et al. | |
| 6,943,409 B1 | 9/2005 | Cheng et al. | |
| 7,221,032 B2 * | 5/2007 | Kondo .......................... 257/401 |
| 2006/0063334 A1 | 3/2006 | Donze et al. | |

OTHER PUBLICATIONS

M. Yang et al., "A high speed, high sensitivity silicon lateral trench photodetector", IEEE Electron Device Letters, vol. 23, p. 395-397, 2002.
M. Yang et al., "High speed silicon lateral trench detector on SOI substrate", IEDM, p. 547-550, 2001.

* cited by examiner

*Primary Examiner*—David Vu
(74) *Attorney, Agent, or Firm*—Patterson & Sheridan, LLP

(57) ABSTRACT

Embodiments of the invention generally relate to the field of semiconductor devices, and more specifically to fin-based junction diodes. A portion of a doped semiconductor fin may protrude through a first doped layer. An intrinsic layer may be disposed on the protruding semiconductor fin. A second semiconductor layer may be disposed on the intrinsic layer, thereby forming a PIN diode compatible with FinFET technology and having increased junction area.

21 Claims, 12 Drawing Sheets

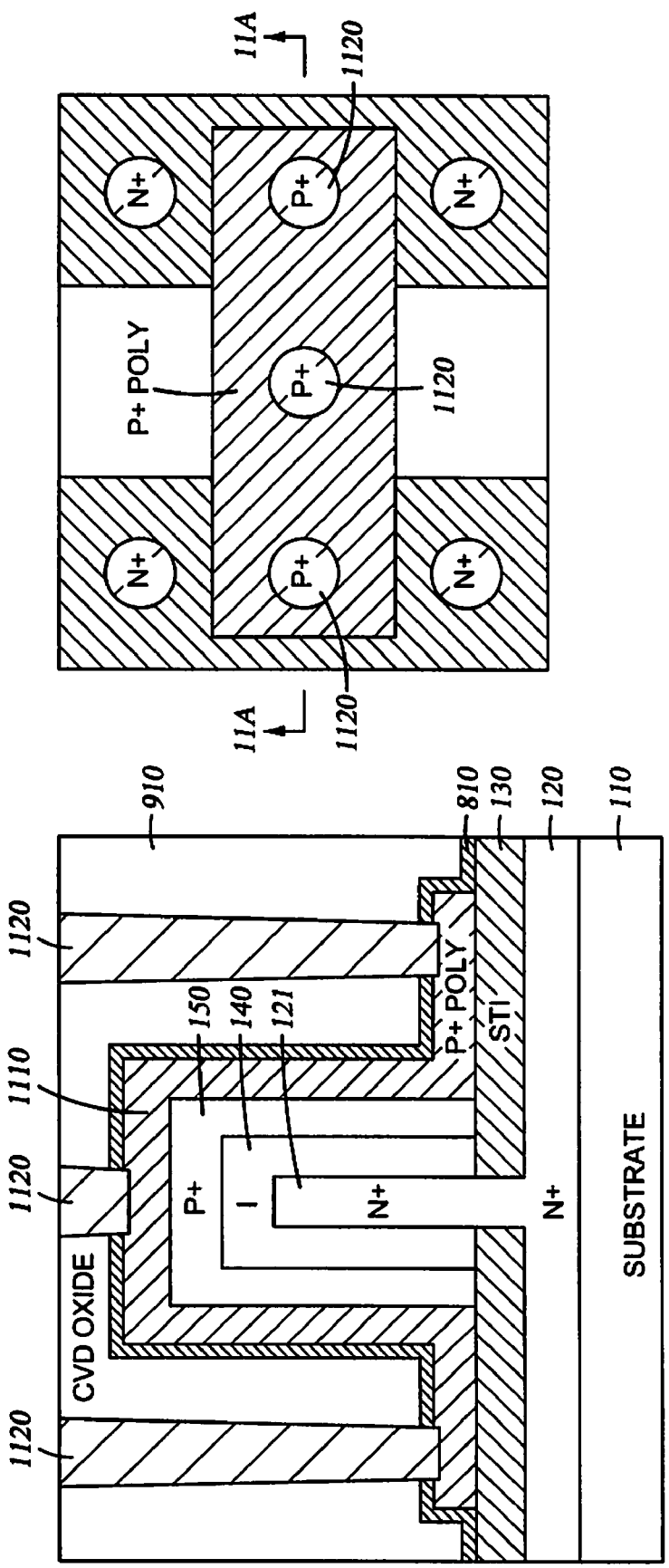

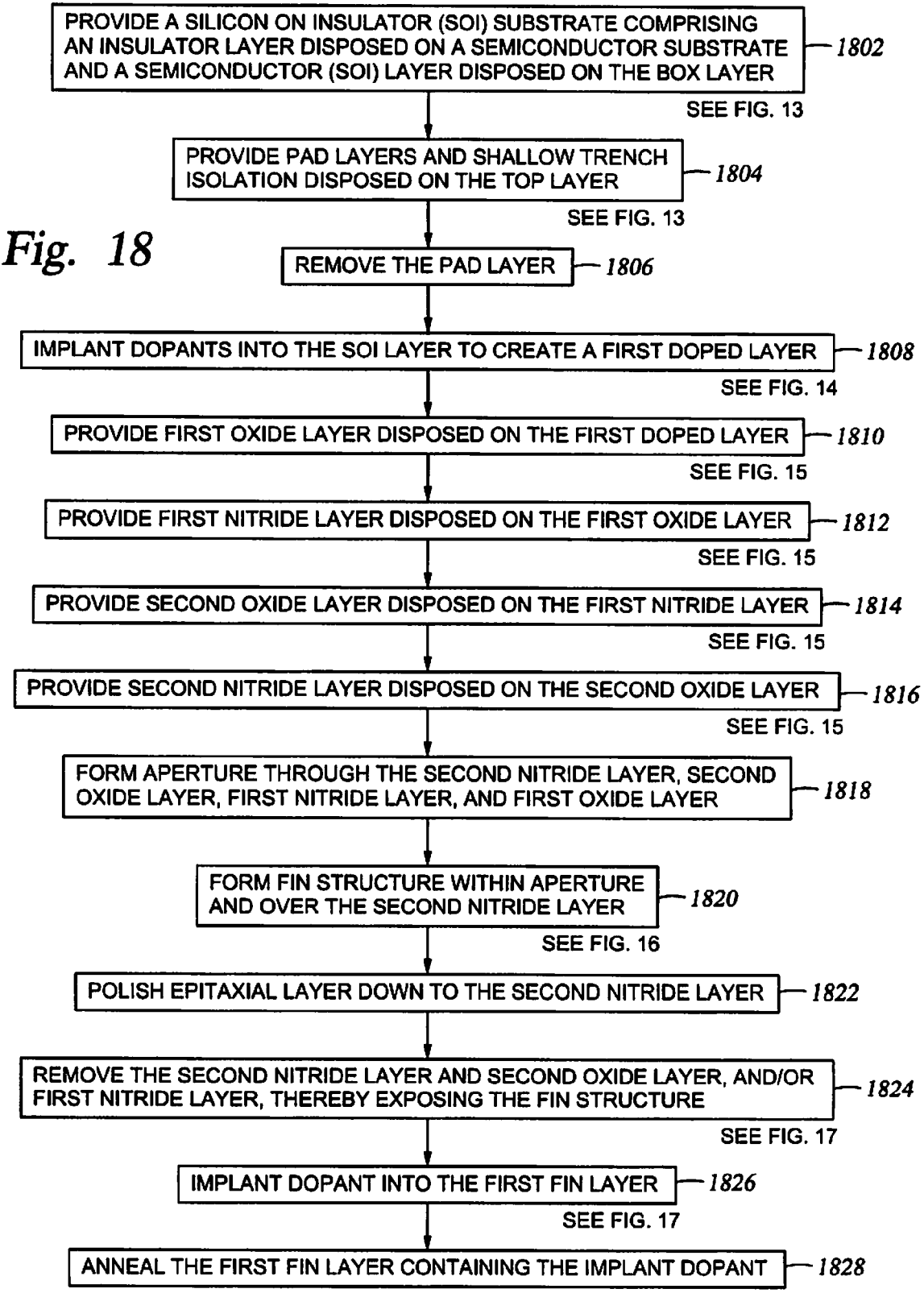

FIN PIN DIODE

BACKGROUND OF THE INVENTION

1. Field of the Invention

The present invention generally relates to the field of semiconductor devices, and more specifically to Fin-based junction diodes.

2. Description of the Related Art

Junction diodes, for example, PIN diodes are commonly used in a wide variety of products such as Radio Frequency (RF) switching devices, telecommunication products, Electrostatic Discharge (ESD) protect devices, imaging sensors, and the like.

The application of PIN diodes may also be extended to photodetectors or optical receivers for emerging optical interconnect technology. For example, when light is illuminated on a PIN photodiode, a current may be generated in the PIN photodiode based on the intensity of the light. When no light is present, the PIN photodiode may be reverse biased, and almost no current may be generated in the PIN photodiode. Therefore, PIN photodiodes are capable of detecting optical signals.

PIN diodes are typically three layer semiconductor devices comprising an intrinsic semiconductor layer sandwiched between p-type and n-type semiconductor layers. Conventional PIN diodes are formed laterally on a substrate by, for example, forming a p-layer, forming an intrinsic (i) layer on top of the p layer, and forming an n layer on top of the i-layer.

However, laterally formed PIN diodes have several disadvantages. In recent years, the need to remain cost and performance competitive in the production of semiconductor devices has resulted in increasing device density in integrated circuits. To facilitate the increase in device density, the feature size of semiconductor devices continues to be reduced. In the case of laterally formed PIN diodes, reducing feature size results in a limited junction area between the p, i, and n layers, thereby reducing the sensitivity of the PIN diode to light, for example.

One solution to achieve reduced feature size without sacrificing PIN diode sensitivity is forming vertical PIN diodes in deep trenches. While forming PIN diodes in deep trenches enhances junction area, and therefore diode sensitivity, the process for forming the PIN diodes is relatively complicated and costly.

Furthermore, the emergence of Fin Field Effect Transistor (FinFET) technology has further complicated the challenge to efficiently form vertical PIN diodes. FinFET based technology allows the formation of high speed CMOS devices. FETs are basic electrical devices used in almost all types on integrated circuit design, for example, in microprocessors, memory, etc. A FinFET comprises a vertical fin shaped structure forming the body of a transistor. Gates may be formed on one or both sides of the fin. A FinFET may provide an increased transistor width, thereby providing the current control of a large transistor without requiring the space consumed by large transistors. However, using FinFET based technology requires the redesign of vertical PIN diodes.

Accordingly, there is a need for developing efficient methods for forming high performance, small feature sized PIN diodes that are compatible with emerging FinFET technology.

SUMMARY OF THE INVENTION

The present invention generally relates to the field of semiconductor devices, and more specifically to fin-based junction diodes.

One embodiment of the invention provides a PIN diode generally comprising a first doped layer formed on a semiconductor substrate comprising a base portion and a fin structure extending outwards from the base portion, and a first insulator layer disposed on the base portion of the first doped layer, wherein a portion of the fin structure protrudes through an opening defined in the first insulator layer. The PIN diode further comprises an intrinsic layer disposed on the portion of the fin structure protruding through the first insulator layer, and a second doped layer disposed on the intrinsic layer.

Another embodiment of the invention provides a method for manufacturing a PIN diode. The method generally comprises forming a first doped layer on a semiconductor substrate, the first doped layer having a base portion and a fin structure extending outwards from the base portion, forming a first insulator layer over the first doped layer so that a first portion of the fin structure is disposed in an opening defined in the first insulator layer and a second portion of the fin structure extends past the opening, forming an intrinsic layer over the second portion of the fin structure, and forming a second doped layer over the intrinsic layer.

Yet another embodiment of the invention provides a method for forming a semiconductor fin structure. The method generally comprises doping a semiconductor layer disposed on an insulator layer, the insulator layer being disposed on a semiconductor substrate, forming a plurality of oxide layers and a plurality of nitride layers over the first doped layer, defining an aperture through the plurality of oxide layers and the plurality of nitride layers, wherein the aperture exposes a portion of the first doped layer, and epitaxially growing the semiconductor fin structure in the aperture.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 11 illustrates another set of cross sectional and top side views of contacts coupled with the PIN diode, according to an embodiment of the invention.

FIG. 18 is a flow diagram of exemplary operations performed to form a fin structure on an SOI substrate, according to an embodiment of the invention.

DETAILED DESCRIPTION OF THE PREFERRED EMBODIMENTS

The present invention generally relates to the field of semiconductor devices, and more specifically to fin-based junction diodes. A doped semiconductor fin may protrude from a first doped layer. An intrinsic layer may be formed adjacent to and surrounding the semiconductor fin. A second semiconductor layer may be formed adjacent to and surrounding the intrinsic layer, thereby forming a PIN diode compatible with FinFET technology and having increased junction area.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Exemplary PIN Diode

Figure 1:
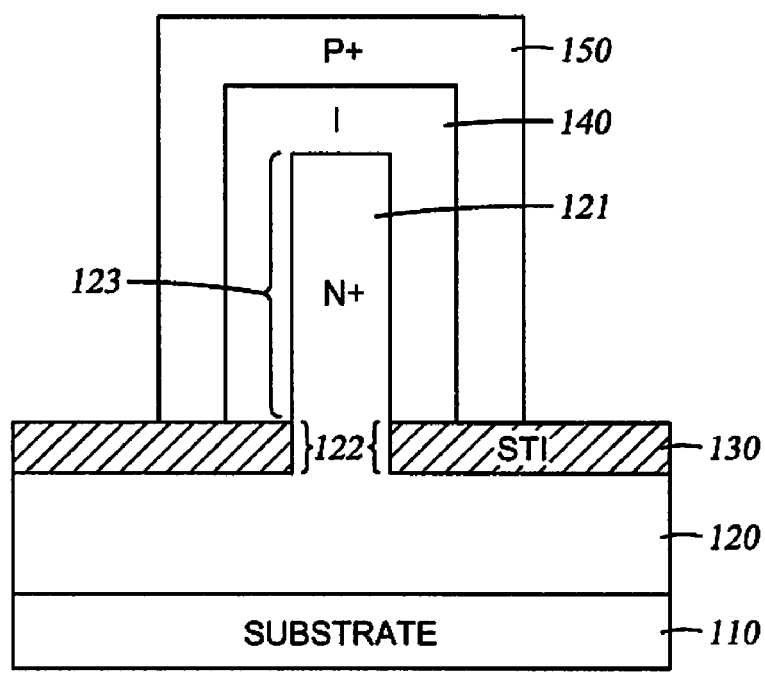
FIG. 1 illustrates an exemplary fin PIN diode according to an embodiment of the invention.

FIG. 1 illustrates an exemplary PIN diode 100 according to an embodiment of the invention. As illustrated in FIG. 1, PIN diode 100 may be formed on a substrate 110. Substrate 110 may be composed of a suitable semiconductor material, for example, silicon, germanium, silicon germanium, gallium arsenic, indium phosphorus, and the like. An N+ doped layer 120 may be formed on substrate 110, as illustrated in FIG. 1. In one embodiment of the invention, N+ doped layer 120 may include a high concentration of a suitable N-type dopant, for example, Arsenic (As) and/or phosphorus (P). In a particular embodiment, the concentration of dopants in the N+ doped layer 120 may be between $5 \times 10^{18}$ cm$^{-3}$ to $1 \times 10^{21}$ cm$^{-3}$.

A semiconductor fin 121 may project outwards from a surface of the N+ doped layer 120 as illustrated in FIG. 1. Fin 121 may have a similar concentration of dopant as the N+ doped layer 120 and may extend vertically outwards from the N+ doped layer 120, as illustrated in FIG. 1. In one embodiment of the invention, fin 121 may have a thickness of around 20 nm to around 100 nm.

PIN diode 100 may also include a shallow trench isolation (STI) layer 130 formed on the N+ doped layer 120. Fin 121 may protrude outwards from an opening in the STI layer 130 such that the STI layer 130 is adjacent to a sidewall portion 122 of fin 121 and extends radially outwards from the sidewall portion 122 of fin 121, as illustrated in FIG. 1. STI layer 130 may isolate the N+ doped layer 120 from layers lying above the STI layer 130, for example, intrinsic layer 140 and P+ doped layer 150, to prevent undesired electronic leakage and short circuiting.

Fin 121 and N+ doped layer 120 may form a first doped layer of a PIN diode. For example, N+ doped layer 120 may form a base layer and fin 121 may extend outwards from the N+ doped layer. A first portion of fin 121 may be disposed in an opening defined in the STI layer 130 as illustrated in FIG. 1. For example, the side wall portion 122 of fin 121 is disposed in an opening in STI layer 130. A portion 123 of fin 121 may extend outwards from the opening in the STI layer, as illustrated in FIG. 1.

The intrinsic semiconductor layer 140 may be formed adjacent to the portion 123 of fin 121 protruding out of the STI layer 130, as illustrated in FIG. 1. In one embodiment of the invention, the intrinsic semiconductor layer 140 may be a pure/neutral semiconductor material, i.e., intrinsic layer 140 may not contain dopants. In other embodiments, intrinsic layer 140 may comprise a relatively lower concentration of dopant in comparison to the N+ doped layer 120 and P+ doped layer 150. For example, in one embodiment of the invention, intrinsic layer 140 may comprise a concentration of less than $1 \times 10^{15}$ cm$^{-3}$ of a suitable N or P type dopant. In one embodiment of the invention, the intrinsic layer 140 may have a thickness of around 20 nm to around 200 nm.

P+ doped layer 150 may comprise a high concentration of a suitable P-type dopant, for example, Boron (B). In a particular embodiment, P+ doped layer 150 may include a concentration of between $5 \times 10^{18}$ cm$^{-3}$ to $1 \times 10^{21}$ cm$^{-3}$ of a suitable P-type dopant material. P+ doped layer 150 may be formed adjacent to intrinsic layer 140, as illustrated in FIG. 1. In one embodiment of the invention, P+ doped layer 150 may have a thickness of around 50 nm to 100 nm. One skilled in the art will recognize, however, that the thickness of fin 121, intrinsic layer 140 and P+ doped layer 150 may depend on the particular application of PIN diode 100, and may vary accordingly.

In one embodiment of the invention, N+ doped layer 120, fin 121, intrinsic layer 140, and P+ doped layer 150 may be made from the same semiconductor material, for example, silicon. In alternative embodiments, each of N+ doped layer 120, fin 120, intrinsic layer 140, and P+ doped layer 150 may be made from different semiconductor materials, for example, any one of silicon, germanium, silicon germanium, and the like. For example, in a particular embodiment, N+ doped layer 120, fin 121, and P+ doped layer 150 may be made from silicon and the intrinsic layer 140 may be made from one of germanium and silicon germanium.

Exemplary Process for Forming PIN Diode

As discussed earlier, a common problem in the prior art is that the shrinking feature size of semiconductor devices has resulted in small junction areas for PIN diodes, thereby negatively affecting sensitivity of the PIN diodes. By allowing a PIN diode to be formed around a silicon fin, for example, fin 121 in FIG. 1, embodiments of the invention provide an increased junction area for PIN diodes per unit area of a semiconductor wafer. Another problem encountered in the prior art is the complexity and cost associated with forming vertical PIN diodes. This section discusses exemplary steps of a novel process for forming a vertical PIN diode compatible with emerging FinFET technology.

Figure 2:
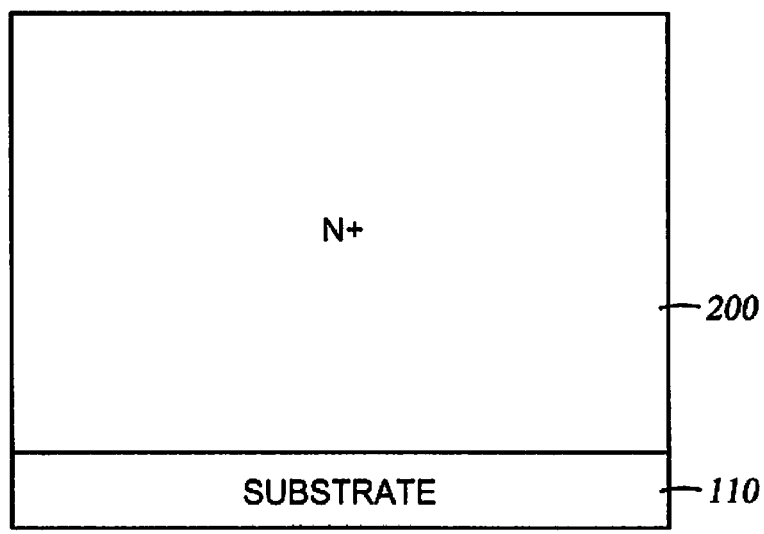
FIG. 2 illustrates an exemplary first doped layer formed on a semiconductor substrate, according to an embodiment of the invention.

Forming a PIN diode 100 may begin by forming an N+ doped region on a substrate. FIG. 2 illustrates an N+ doped region 200 formed on a substrate 110. In one embodiment of the invention, the thickness of N+ doped region may be around 100 nm to around 5000 nm. In one embodiment of the invention, the concentration of dopants in the N+ doped region 200 may be between $5 \times 10^{18}$ cm$^{-3}$ to $1 \times 10^{21}$ cm$^{-3}$. The N+ doped region 200 may be formed on a substrate 110 using techniques well known in the art such as, for example, ion implantation, gas phase doping, liquid phase doping, solid phase doping, infusion doping, and the like.

Ion implantation may involve electrostatically accelerating a predetermined dose of ions of a desired element to a high energy and firing the ions at a surface of substrate 110. The ions may become implanted in substrate 110 along a depth determined by the energy and acceleration of the ions, thereby forming the N+ doped region 200 on substrate 110.

In one embodiment of the invention, N+ doped layer may be formed by a suitable diffusion procedure. Diffusion may involve heating the substrate to a high temperature and placing a high concentration of a dopant material, for example, in a solid, liquid, or gas phase, adjacent to the substrate surface. A portion of the dopants in the high concentration of dopant material may be transferred into the substrate surface, thereby creating N+ doped region 200.

Alternatively, the N+ doped region 200 may be formed by epitaxial growth with doping introduced either while the semiconductor layer is growing (in situ), or after the layer is fully grown. Epitaxial growth may involve depositing a semiconductor material on top of substrate 110. In other words, an N+ doped semiconductor material may be deposited on the substrate 110 to form the N+ doped region 200. In situ epitaxial growth may involve doping an epitaxial layer as it is deposited on a substrate surface. Alternatively, epitaxial growth may first be performed with relatively light doping, and subsequently implanting or diffusing dopants into the epitaxial layer after it is deposited.

Figure 3:
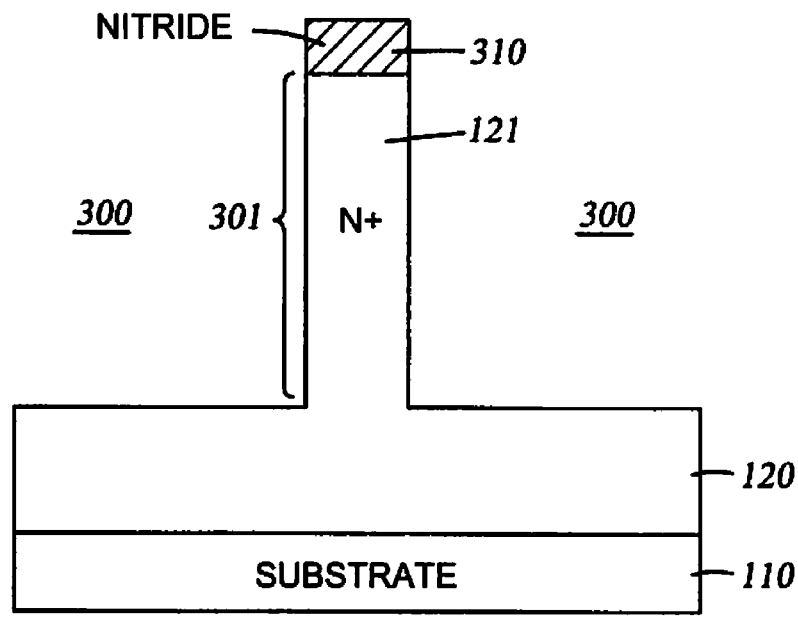
FIG. 3 illustrates a semiconductor fin according to an embodiment of the invention.

A semiconductor fin 121 may be formed in the N+ doped region 200, as illustrated in FIG. 3. For example, any known patterning or etching process may be employed to remove a portion 300 of the N+ doped region 200 to form a fin 121. Fin 121 may have a width of around 5 nm to around 1 μm. In a preferred embodiment, fin 121 may have a width of around 20 nm to around 100 nm. The height of fin 121 may range from around 100 nm to around 5000 nm. In a preferred embodiment, the height of fin 121 may range from 500 nm to around 2000 nm. As illustrated in FIG. 3, removing the portion 300 may also form the N+ doped layer 120 in addition to fin 121 (See also FIG. 1).

In one embodiment of the invention, processes for removing the portion 300 may include conventional optical lithography, electron beam lithography, spacer imaging techniques, and the like for patterning. Patterning may involve developing a mask, for example, a photoresist mask, on a semiconductor surface to facilitate etching of an underlying semiconductor layer.

Following patterning, a suitable etching process may be used to remove the portion 300, which may be exposed by the mask. The etching process may be a wet etching process or a dry etching process. A wet etching process may involve the use of liquid etchants configured to remove material exposed by the patterning through chemical processes. On the other hand, a dry etching process may involve the use of gas-phase etchants configured to remove material exposed by the patterning using a combination of physical and chemical processes.

In one embodiment of the invention, a timed Reactive Ion Etching (RIE) process may be used to remove the portion 300 of N+ doped region 200. RIE may involve using plasma, i.e. ionized gas, to etch exposed material. In a particular embodiment, an inductively coupled plasma (ICP) RIE process may be employed during etching.

In one embodiment of the invention, patterning may involve forming a nitride cap 310 on the surface of N+ doped region 200. Nitride cap 310 may be formed by depositing a nitride layer on the surface of a doped region 200 and etching the nitride layer using a photoresist mask. For example, in one embodiment, a photoresist mask may be used to define a nitride cap region in a nitride layer deposited on the surface of an N+ doped region 200. Subsequently, the nitride layer may be etched, for example, in a fluorine plasma to form nitride cap 310. One advantage of developing a nitride cap 310 may be to provide adequate protection to fin 121 during subsequent process steps, for example, an RIE process to remove the portion 300 of N+ doped region 200.

Figure 4:
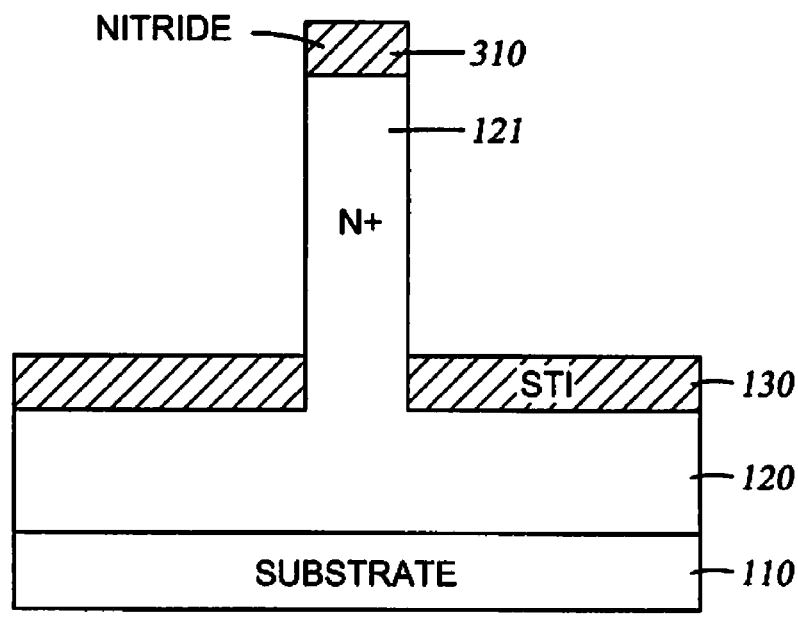
FIG. 4 illustrates a Shallow Trench Isolation (STI) layer according to an embodiment of the invention.

An STI layer 130 may be formed on the surface of the N+ doped layer 120, as illustrated in FIG. 4. Forming STI layer 130 may involve performing a Chemical Vapor Deposition (CVD) process. Chemical vapor deposition may involve exposing a substrate to one or more precursors, for example, one or more gases, which react and/or decompose to form a desired film on the surface of the N+ doped layer 120. Any suitable CVD process, for example, Atmospheric Pressure CVD (APCVD), Low Pressure CVD (LPCVD), Plasma Enhanced CVD (PECVD), and the like may be used to form the STI layer 130.

In one embodiment of the invention, forming the STI layer 130 may involve a Spin-On-Glass (SOG) process. SOG processes may involve coating a substrate with a liquid film which forms a solid film when heated. In other embodiments, a LOCal Oxidation of Silicon (LOCOS) procedure may be used to develop STI layer 130. LOCOS procedures may involve baking a substrate at high temperatures in a furnace in the presence of an oxidizing ambient for a predefined period of time to develop an STI layer of a desired depth on the substrate surface. The thickness of STI layer 130 may be sufficient to provide adequate isolation. For example, in one embodiment, the STI layer may have thickness from around 20 nm to around 100 nm.

In one embodiment of the invention, after an STI layer 130 is formed on the surface of the N+ doped layer 120, a conventional etch process, for example, an RIE process or a plasma etch process may be preformed to recess the oxide.

For example, in one embodiment, STI layer 130 may be deposited on the surface of N+ doped layer 120 such that the top of the STI layer 130 is above nitride cap 310. Subsequently, the STI layer 130 may be planarized to the level of nitride cap 310. Following planarization, an RIE process or a plasma etch process may be performed to achieve an STI layer 130 of a desired thickness.

In one embodiment of the invention, if a nitride cap 310 is utilized, the nitride cap 310 may be stripped after the portion 300 of N+ doped region 200 is removed and the STI layer is formed. Nitride cap 310 may be stripped using, for example, hot phosphoric acid, or a suitable dry etching process. Using hot phosphoric acid may be desirable because the nitride cap 310 may be removed without affecting fin 121 and STI layer 130. The structure formed after the nitride cap 310 is removed is illustrated in FIG. 5.

Figure 5:
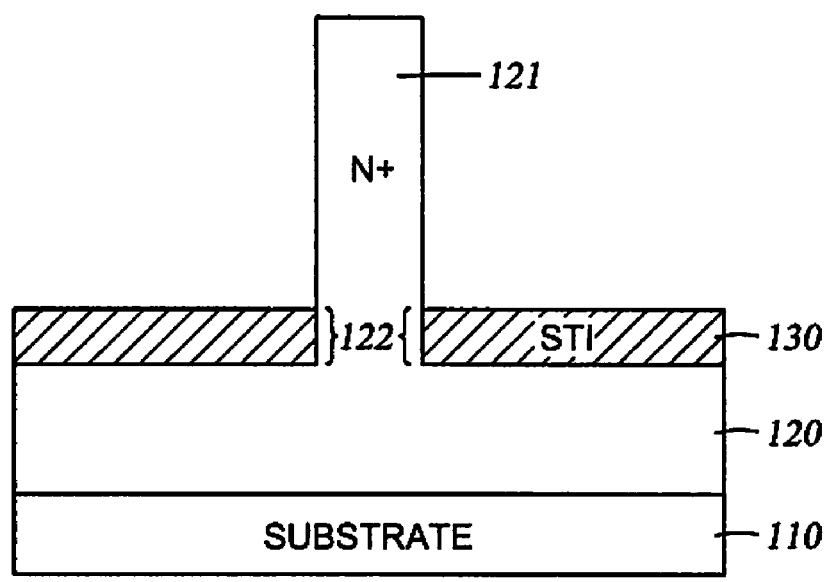
FIG. 5 illustrates another view of a semiconductor fin according to an embodiment of the invention.

As illustrated in FIG. 5, the semiconductor structure 500 includes an N+ doped fin 121, an N+ doped layer 120, and an STI layer 130 formed on a substrate 110. STI layer 130 may be deposited on top of the N+ doped layer 120. Furthermore, fin 121 may protrude from the N+ doped layer 120 and through the STI layer 130 such that the STI layer 130 is adjacent to and extends radially outwards from a sidewall portion 122 of fin 121.

Figure 6:
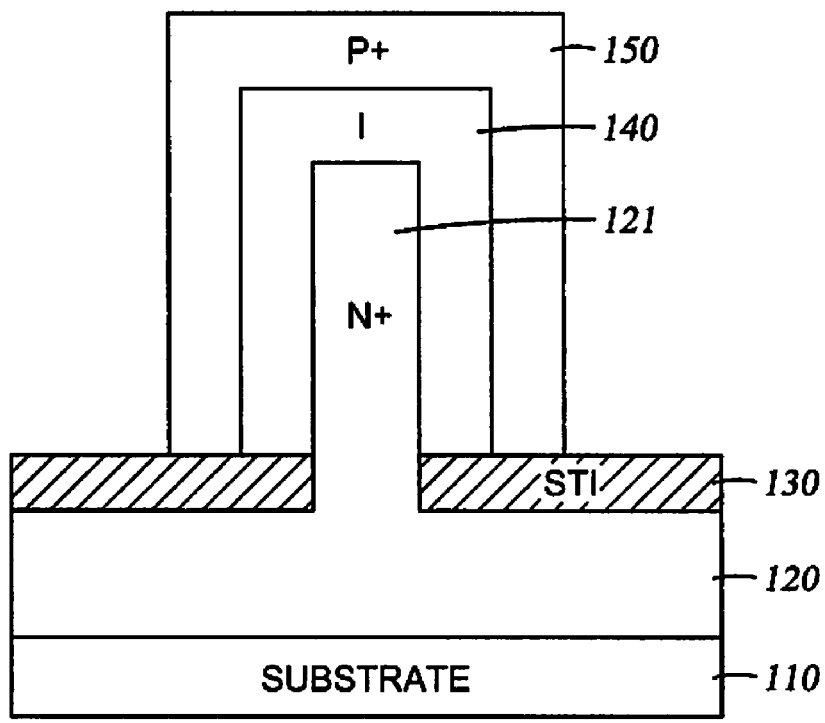
FIG. 6 illustrates a PIN diode according to an embodiment of the invention.

A PIN diode may be formed by forming an intrinsic semiconductor layer 140 and a P+ doped layer 150 around the portion of fin 121 protruding from STI layer 130, as illustrated in FIG. 6. In one embodiment of the invention, intrinsic layer 140 and P+ doped layer 150 may be formed by epitaxial growth. Epitaxial growth may involve ordered crystalline growth of crystals of one substance on the crystal surface of another or the same substance.

Accordingly, an intrinsic layer 140 may first be epitaxially grown adjacent to fin 121 as illustrated in FIG. 6. Subsequently, a P+ doped layer 150 may be epitaxially grown adjacent to the intrinsic layer 140, as illustrated in FIG. 6. One skilled in the art will recognize that any suitable form of epitaxial growth, for example, molecular beam epitaxy, liquid phase epitaxy, vapor phase epitaxy, and the like, may be used to form the intrinsic layer 140 and P+ doped layer 150.

Figure 7:
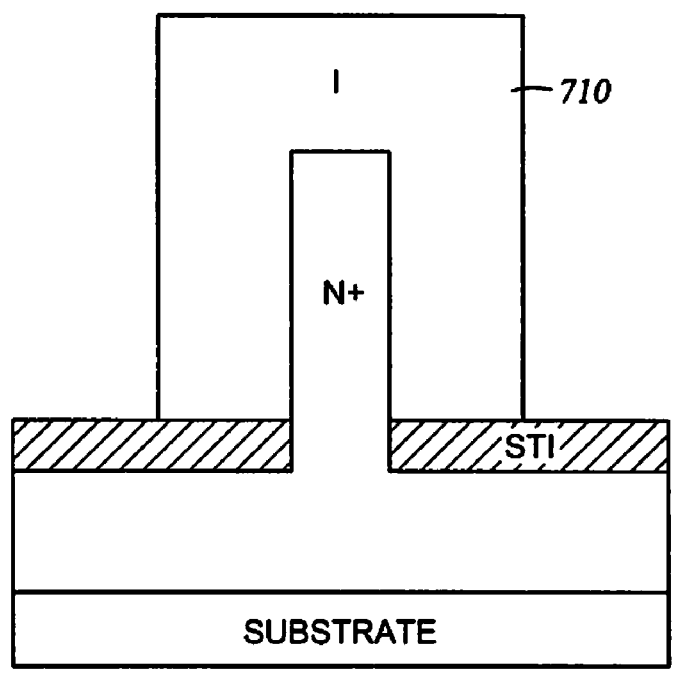
FIG. 7 illustrates a thick intrinsic layer according to an embodiment of the invention.

In one embodiment of the invention, forming a PIN diode may involve forming a thick intrinsic layer adjacent to fin 121 and subsequently doping a portion of the thick intrinsic layer to form the P+ doped layer 150. FIG. 7 illustrates a thick intrinsic layer 710 formed adjacent to fin 121. In one embodiment of the invention, thick intrinsic layer 710 may be formed by epitaxial growth and may have a thickness of around 700 nm to 300 nm. Intrinsic layer 710 may or may not contain dopants. If dopants are included, intrinsic layer 710 may include a concentration of less than $1 \times 10^{15}$ cm$^{-3}$ of a suitable N or P type dopant.

An outer region of the intrinsic layer 710 may be doped to form a P+ doped layer 150 encompassing an intrinsic layer 140. In one embodiment of the invention, intrinsic layer 710 may be doped by a suitable diffusion process. Diffusion doping may involve any reasonable doping method, for example, gas phase doping, liquid phase doping, solid phase doping, plasma doping, and the like. One skilled in the art will also recognize that any other reasonable doping method, for example, ion implantation may also be used to form a P+ doped layer within the intrinsic layer 710. The resulting structure may be similar to the structure illustrated in FIG. 6 comprising a fin 121, intrinsic layer 140, and a P+ doped layer 150.

Figure 8:
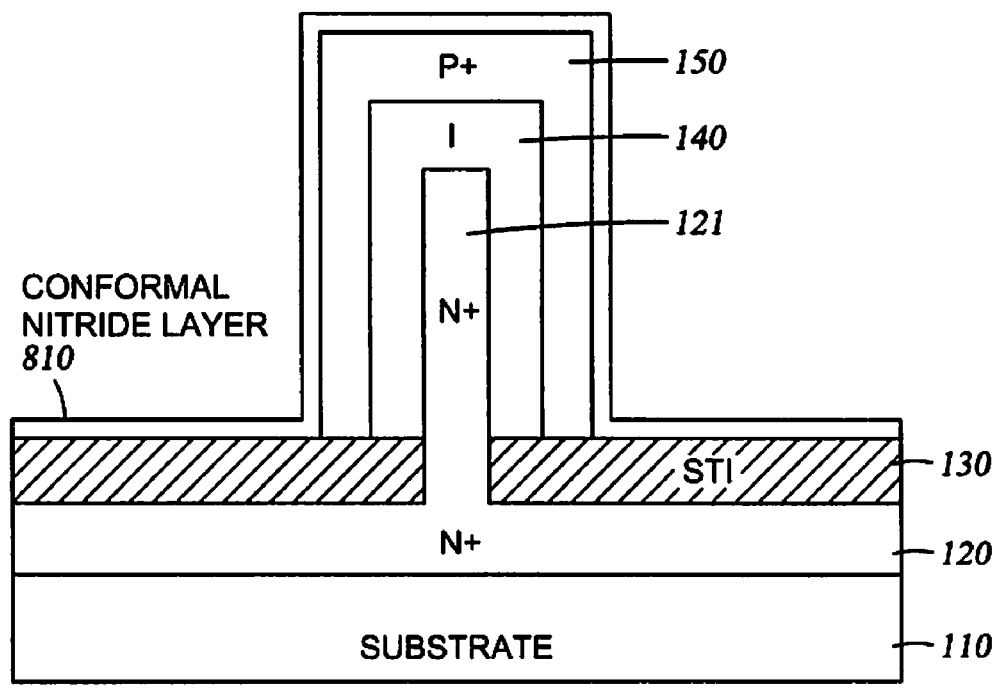
FIG. 8 illustrates a nitride layer deposited on a PIN diode, according to an embodiment of the invention.

A conformal nitride layer 810 may be deposited on the surface of the PIN diode, as illustrated in FIG. 8. Nitride layer 810 may be deposited on the surface of the PIN diode using a suitable CVD process, and may range in thickness from around 5 nm to 50 nm. In one embodiment of the invention, nitride layer 810 may be composed of a suitable anti-reflective material to enhance the absorption of light. In alternative embodiments, an anti reflective coating may also be formed by roughening the surface of the P+ doped layer 150 to enhance the absorption of light.

In one embodiment of the invention, nitride layer 810 may serve as an oxide etch stop for contact via etching. The function of the nitride layer 810 as an etch stop is discussed in greater detail below.

Figure 9:
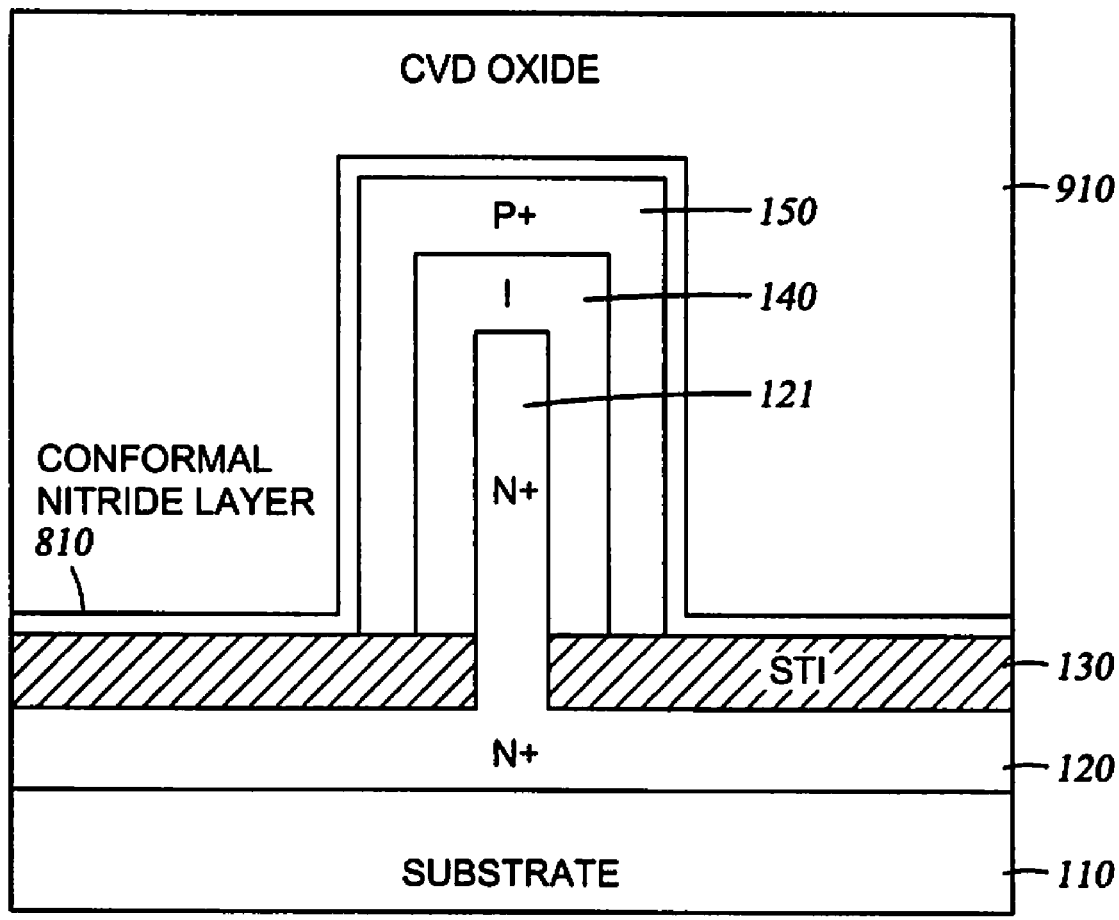
FIG. 9 illustrates an oxide layer formed on the PIN diode according to an embodiment of the invention.

An oxide layer 910 may be deposited on and planarized on the PIN diode, as illustrated in FIG. 9. Oxide layer 910 may be deposited using a suitable CVD process and may have a thickness of around 50 nm to 200 nm over the top of fin 121. Oxide layer 910 may provide passivation for exposed semiconductor surfaces and may provide an insulating substrate upon which upper levels, for example, metal wiring, may be formed.

Figures 10A, 10B:
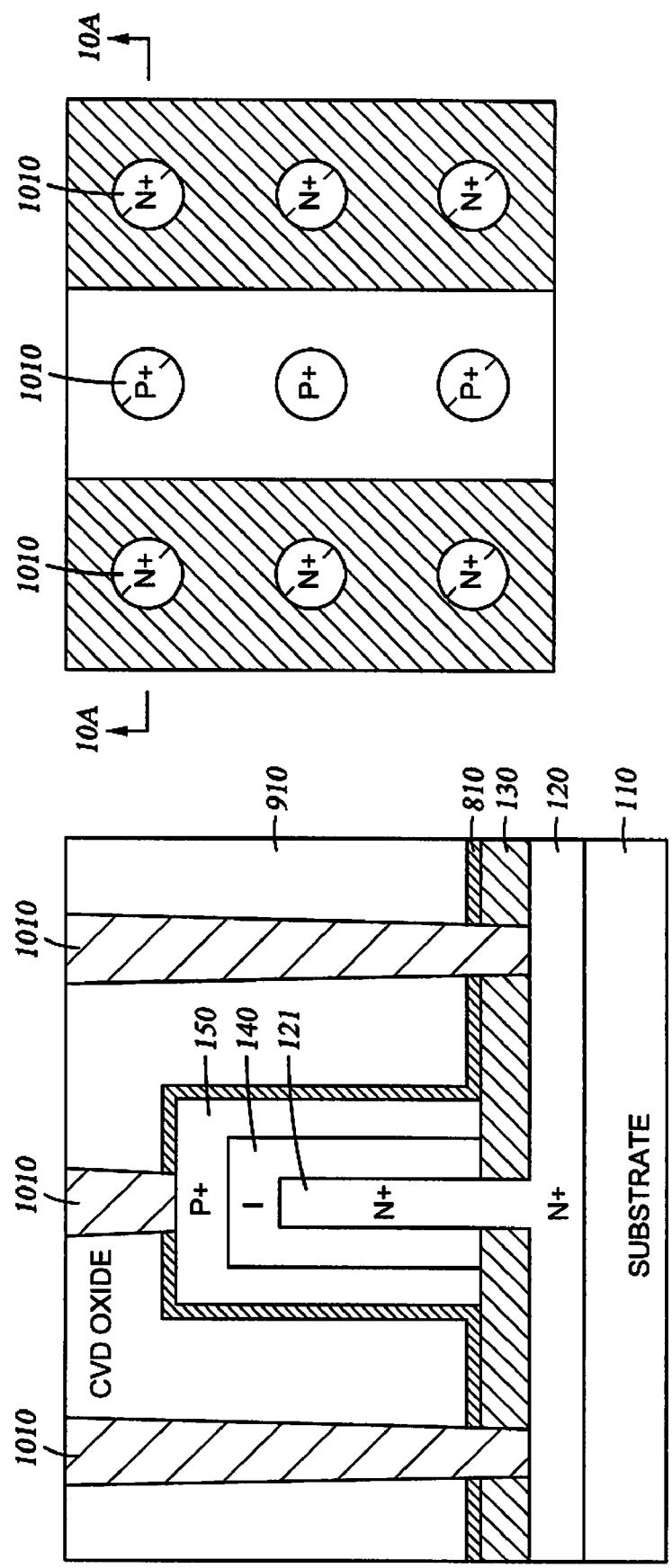
FIG. 10 illustrates cross sectional and top side views of contacts coupled with the PIN diode, according to an embodiment of the invention.

Contacts 1010 may be formed in the oxide layer 910 to provide access to the cathode (N+) and anode (P+) regions of the PIN diode, as illustrated in the cross sectional view of the PIN diode in FIG. 10. Forming contacts 1010 may involve depositing a Bottom Anti-Reflective Coating (BARC) and photoresist layers on the surface of the oxide layer 910. The BARC may be provided to lower reflectance back into a photoresist layer by absorbing radiation that has passed through a photoresist layer and dissipating the energy as heat.

The photoresist layer may be patterned and exposed to light to develop a mask defining regions for contacts 1010. Subsequently, an oxide RIE process may be performed down to the nitride etch stop layer 810. For a P+ contact, a recess may be formed in the nitride etch stop layer 810 to form a via exposing the P+ doped layer 150. For the N+ doped layer 120, a recess may be formed in the nitride etch stop layer and a final oxide RIE process may be performed on the exposed STI layer 130 to form vias exposing the N+ doped layer 120. Once the vias are open, a suitable metal, for example, tungsten or N+ doped polysilicon may be deposited in the vias and planarized.

FIG. 10 also depicts a top view of contacts 1010 on the surface of a semiconductor device comprising PIN diodes. For example, a top view of P+ contact 1010 is shown correlated with a cross sectional view of the P+ contact 1010 in FIG. 10. Similarly, a top view of N+ contact 1010 is shown correlated with a cross sectional view of the N+ contact 1010 in FIG. 10.

In one embodiment of the invention, a P+ polysilicon stripe 1110 may be deposited adjacent to the PIN diode as illustrated in FIG. 11. The P+ polysilicon stripe 1110 may be formed, for example, by conventional CVD deposition of poly-crystalline silicon, adjacent to the P+ doped region 150 such that one or more contacts 1120 are electrically coupled with the P+ doped layer 150, as illustrated in FIG. 11. In one embodiment of the invention, the P+ polysilicon stripe 1110 may be provided to prevent contact metallurgy from punching through the P+ doped layer 150 and encroaching upon the intrinsic layer 140. Contact metallurgy touching the depletion region of the diode (e.g. intrinsic layer) would greatly increase its electrical leakage and must be avoided.

Figure 12:
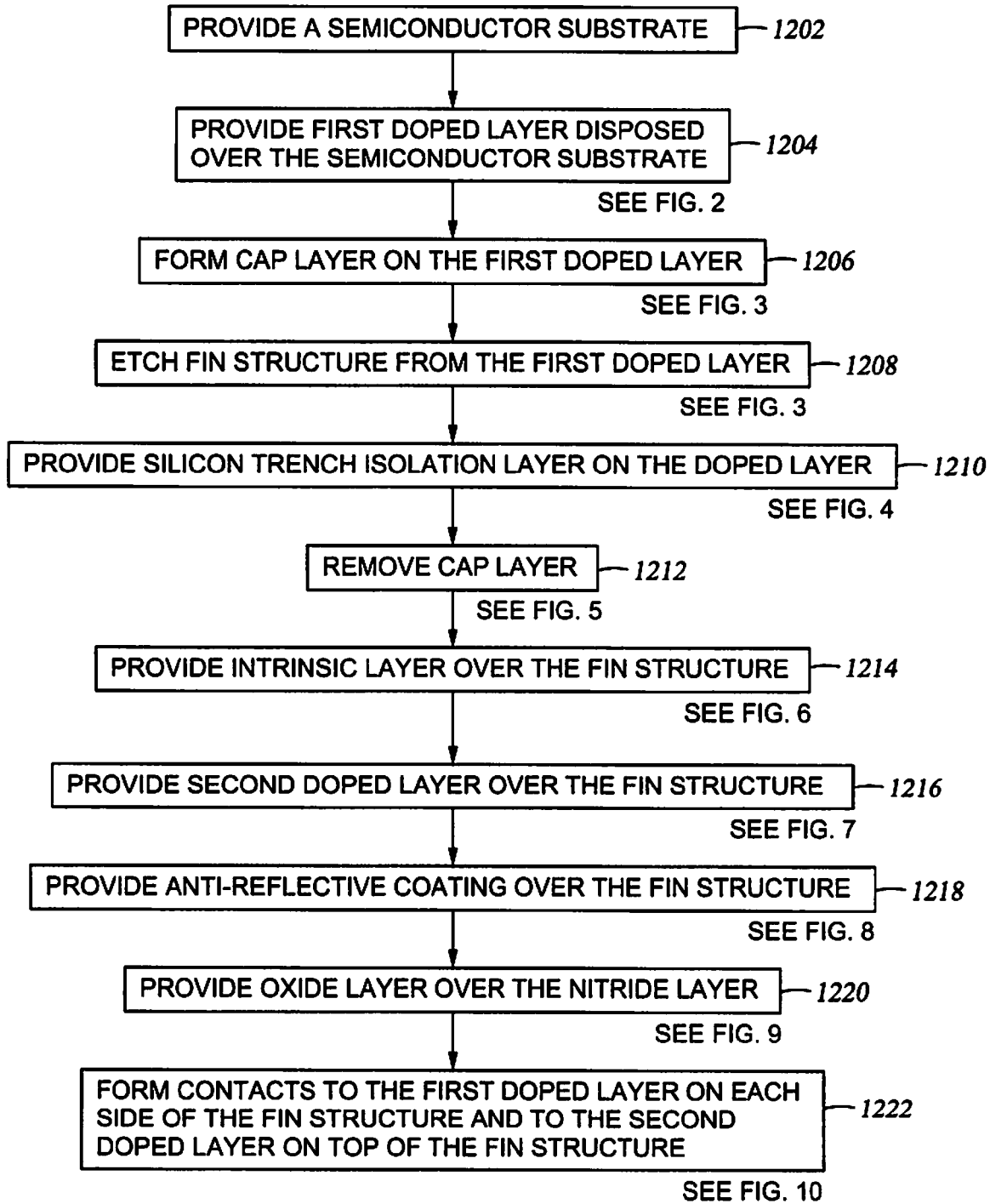
FIG. 12 is a flow diagram of exemplary operations performed to form a fin PIN diode according to an embodiment of the invention.

FIG. 12 is a flow diagram of exemplary operations performed to form a PIN diode, according to an embodiment of the invention. The operations may begin in step 1202 by providing a semiconductor substrate. For example, a silicon, germanium, or silicon germanium substrate may be provided. In step 1204, a first doped layer may be formed on the surface of the substrate. The first doped layer may correspond to the N+ doped region 200 illustrated in FIG. 2.

In step 1206, a nitride cap may be formed on the first doped layer. The nitride cap may correspond to nitride cap 310 illustrated in FIG. 3. In step 1208, a fin structure may be formed by etching exposed portions of the first doped layer that are not covered by the nitride cap. For example, the etched portion may correspond to the portion 300 of N+ doped region 200 shown etched away in FIG. 3.

In step 1210, an STI layer may be deposited on the first doped layer such that the STI layer is adjacent to and extends radially away from a sidewall portion of the fin structure. The STI layer may correspond to the STI layer 130 illustrated in FIG. 4. In step 1212 the nitride cap may be removed, for example, using hot phosphoric acid.

In step 1214, an intrinsic layer may be formed adjacent to the fin structure. The intrinsic layer may correspond to the intrinsic layer 140 illustrated in FIG. 6. The intrinsic layer may be made from a neutral semiconductor material or may contain a small concentration of N or P dopants. In one embodiment of the invention, the intrinsic layer is epitaxially grown adjacent to the fin structure.

In step 1216, a second doped layer may be formed adjacent to the intrinsic layer. The second doped layer may correspond to P+ doped layer 150 illustrated in FIG. 6. In one embodiment of the invention, the second doped layer may be epitaxially grown adjacent to the intrinsic layer. In an alternative embodiment, the second doped layer may be formed by doping a portion of the intrinsic layer, for example, using a dopant diffusion process.

In step 1218, an anti reflective coating may be formed over the fin structure to enhance absorption of light. The anti-reflective coating may be formed, for example, by depositing a nitride layer on the fin structure or by roughening the surface of the second doped layer. The nitride layer may correspond to the nitride layer 810 illustrated in FIG. 8.

In step 1220, an oxide layer may be deposited on and planarized over the fin structure. The oxide layer may correspond to oxide layer 910 illustrated in FIG. 9. In step 1222, contacts may be formed through the oxide layer to electrically access the first doped layer on either side of the fin structure, and the second doped layer on top of the fin structure.

Method for Forming PIN Diode on a SOI Substrate

In one embodiment of the invention, the PIN diode 100 illustrated in FIG. 1 may be formed on a Silicon On Insulator (SOI) substrate. An SOI substrate may include an oxide layer formed on a semiconductor substrate. A semiconductor layer may be formed on top of the oxide layer. Semiconductor devices, for example, the PIN diode 100 may be formed in the semiconductor layer formed on the oxide layer. One advantage of the SOI structure is that the oxide layer acts as an insulator and reduces parasitic capacitances, thereby allowing higher speed circuits. This section discusses exemplary steps for forming the novel PIN structure on an SOI substrate.

Figure 13:
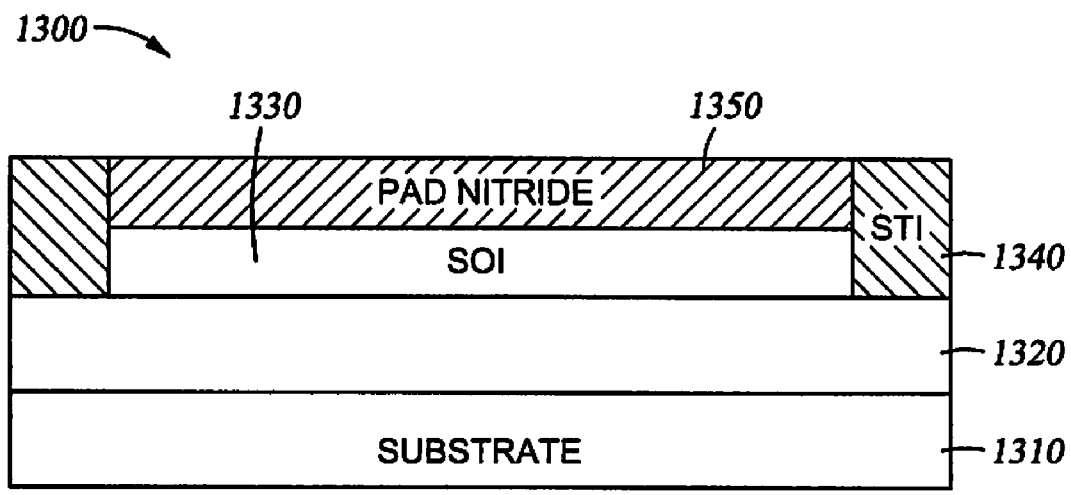
FIG. 13 illustrates a Silicon On Insulator (SOI) substrate according to an embodiment of the invention.

FIG. 13 illustrates an exemplary SOI structure 1300 according to an embodiment of the invention. SOI structure 1300 may include a substrate 1310, an insulator layer 1320, and an SOI layer 1330. Substrate 1310 may be similar to substrate 110 of FIG. 1 and may be made from a suitable semiconductor material, for example, Silicon, Germanium, Silicon Germanium, gallium arsenic, indium phosphorus, and the like.

As illustrated in FIG. 13, insulator layer 1320 may be formed on top of and adjacent to the substrate 1310. In one embodiment of the invention, insulator layer 1320 may be a Buried Oxide (BOX) layer. An SOI layer 1330 may be formed on top of a portion of the insulator layer 1320, as illustrated in FIG. 13. SOI layer 1330 may be made from any suitable semiconductor material, for example, Silicon, Germanium, Silicon Germanium, gallium arsenic, indium phosphorus, and the like. The SOI layer 1330 may or may not be made from the same semiconductor material as substrate 1310.

In one embodiment of the invention, forming a PIN diode may involve forming a pad nitride layer 1350 on top of the SOI layer 1330 and a STI layer 1340 on top of portions of the insulator layer 1320 not covered by the SOI layer 1330, as illustrated in FIG. 13. For example, a pad nitride layer may first be deposited on the SOI layer 1330. An STI layer may then be deposited on the surface of the structure 1300. Subsequently, the surface of the structure 1300 may be planarized to form the structure 1300 depicted in FIG. 13. In other words, planarizing may result in a pad nitride layer on top of the SOI layer 1330 and an STI layer 1340 on top of portions of the insulator layer 1320 not covered by the SOI layer 1330.

Figure 14:
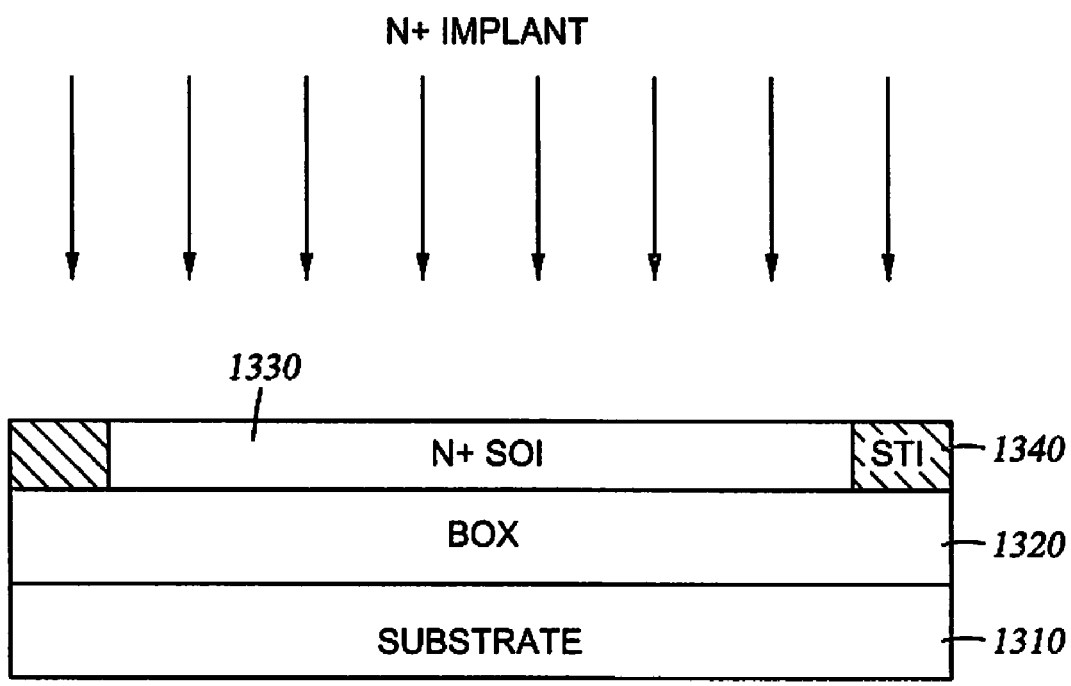
FIG. 14 illustrates doping of an SOI layer according to an embodiment of the invention.

Subsequently, the pad nitride layer 1350 may be stripped to prepare the SOI layer 1330 for doping, as illustrated in FIG. 14. In one embodiment of the invention, the SOI layer 1330 may be doped using a non critical block mask to protect non-diode areas on the surface of SOI layer 1330. As illustrated in FIG. 14, in one embodiment, an ion implantation procedure may be used to implant a dose of a suitable N type dopant in the SOI. In a preferred embodiment, the dose and energy during the ion implantation procedure may be adjusted to produce a concentration of around $5 \times 10^{18}$ cm$^{-3}$ to $1 \times 10^{21}$ cm$^{-3}$ of dopant in the SOI. While ion implantation is disclosed herein, one skilled in the art will recognize that any reasonable doping procedure, for example, a diffusion based doping procedure may also be used to dope the SOI layer 1330.

Figure 15:
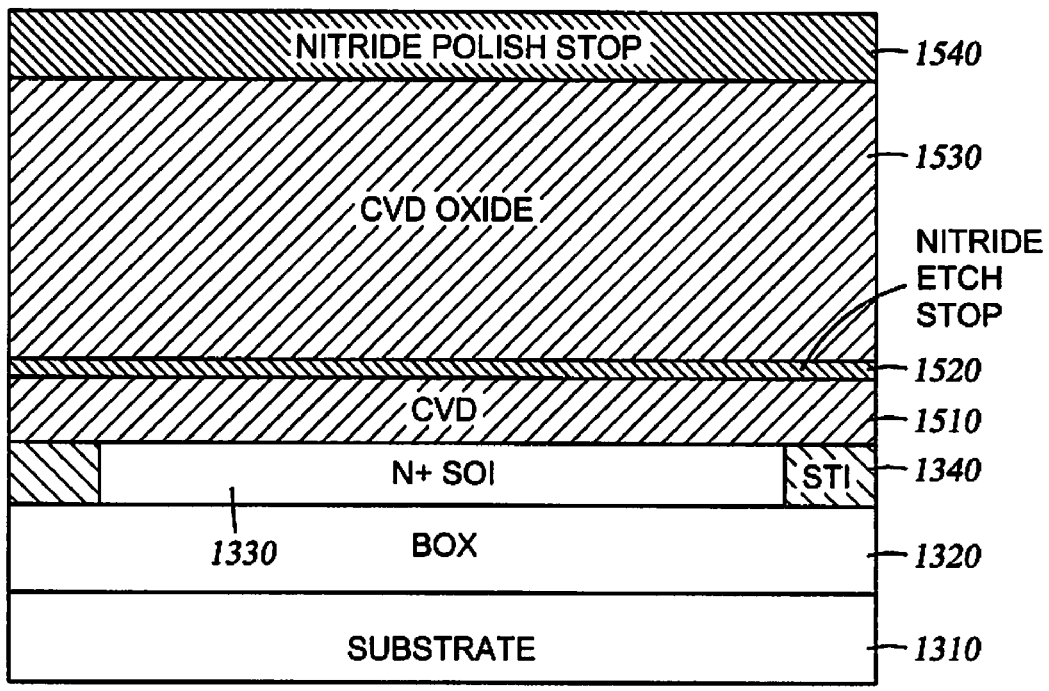
FIG. 15 illustrates a plurality of nitride and oxide layers deposited on an SOI substrate for forming a fin structure, according to an embodiment of the invention.

A plurality of nitride and oxide layers may be deposited on an N+ doped SOI layer 1330 to form a fin thereon, as illustrated in FIG. 15. For example, a first oxide layer 1510 may be deposited adjacent to the surface of the N+ SOI layer 1330. The first oxide layer 1510 may have a thickness of around 20 nm to 200 nm. Oxide layer 1510 may correspond to the STI layer 130 of FIG. 1.

A thin first nitride layer 1520 may be deposited on top of the first oxide layer 1510 by, for example, a suitable CVD process. Nitride layer 1520 may be provided to serve as an etch stop during a subsequent RIE process for forming a semiconductor fin. In one embodiment of the invention, nitride layer 1520 may have a thickness of around 5 nm to around 20 nm.

A relatively thicker second oxide layer 1530 may be formed on top of the nitride etch stop layer 1520, as illustrated in FIG. 15. The second oxide layer 1520 may be formed, for example, using a CVD process to a thickness of around 100 nm to around 5000 nm. The thick second oxide layer 1530 may be provided for forming a fin structure therein.

A second nitride layer 1540 may be formed on top of the second oxide layer 1530. Nitride layer 1540 may serve as a polish stop to facilitate planarization of an epitaxial fin layer subsequently grown within the structure illustrated in FIG. 15. In one embodiment of the invention, nitride polish stop layer 1540 may have a thickness of around 20 nm to around 100 nm.

Figure 16:
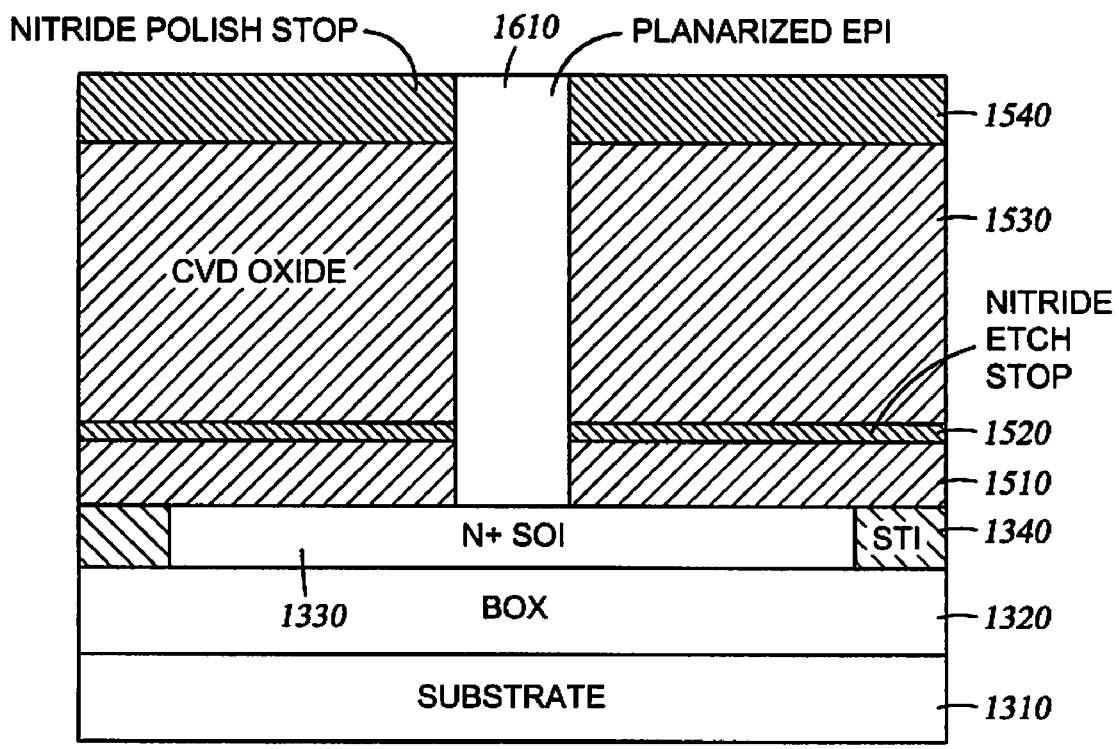
FIG. 16 illustrates a fin structure formed on an SOI substrate according to an embodiment of the invention.

A fin aperture may be formed through nitride polish stop layer 1540, second oxide layer 1530, nitride etch stop layer 1520, and first oxide layer 1510 using an RIE process, so that the N+ SOI layer 1330 is exposed at the bottom of the aperture. Subsequently, a fin structure 1610 may be epitaxially grown up through the aperture, as illustrated in FIG. 16. In one embodiment of the invention, the fin structure 1610 may be overgrown such that the fin structure 1610 extends over the nitride polish stop layer 1540. The overgrown portion of the fin structure 1610 may be polished using the nitride layer 1540 as a polish stop.

One skilled in the art will recognize that the height of the fin structure 1610 may depend on the selection of thicknesses of the first oxide layer 1510, first nitride layer 1520, second oxide layer 1530, and the second nitride layer 1540. The thicknesses of the first oxide layer 1510, first nitride layer 1520, second oxide layer 1530, and the second nitride layer 1540 may accordingly be selected to achieve a desired height of fin structure 1610.

After the fin structure 1610 is grown and planarized, the nitride polish stop layer 1540 may be removed, for example, with a hot phosphoric acid etch. The exposed second oxide layer 1530 may also be removed using a fluorine containing wet etch process, for example using Hydrofluoric acid. Alternatively, a suitable dry etching process may also be used to remove the second oxide layer 1530. The nitride layer 1520 may act as an etch stop during the etching process for removing the second oxide layer 1530. After the second oxide layer 1530 is removed, the exposed nitride etch stop layer 1520 may also be removed, for example using a hot phosphoric acid or other type of nitride etch.

Removing nitride polish stop layer 1540, second oxide layer 1530, and nitride etch stop layer 1520 may leave a substantial portion of the fin structure 1610 exposed. The fin structure 1610 may then be doped with a suitable N type dopant to such that fin structure 1610 comprises a concentration of around $5 \times 10^{18}$ cm$^{-3}$ to $1 \times 10^{21}$ cm$^{-3}$ of dopant material.

Figure 17:
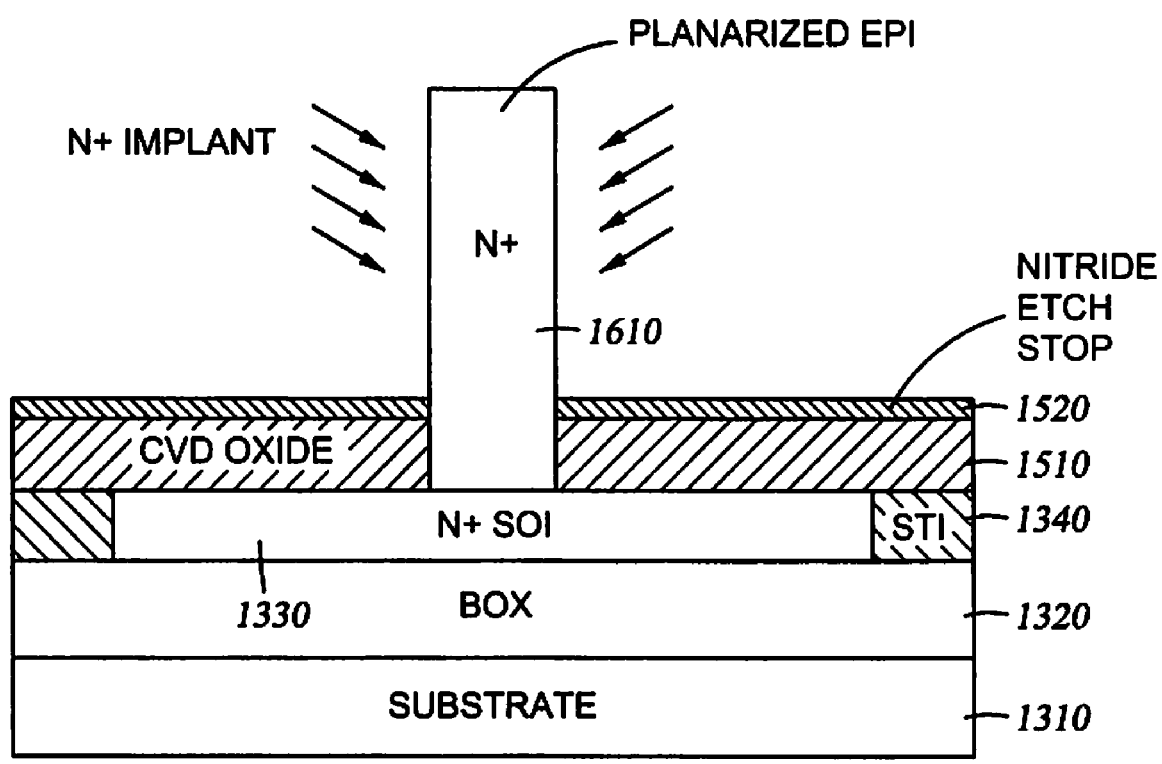
FIG. 17 illustrates doping of a fin structure formed on an SOI substrate, according to an embodiment of the invention.

In one embodiment of the invention, fin structure 1610 may be doped using an angled ion implantation procedure, as illustrated in FIG. 17. Angled ion implantation may involve accelerating ions and firing the ions at an angle relative to a surface of the fin structure 1610, for example, the sidewalls of fin structure 1610, as illustrated in FIG. 17. While angled ion implantation is disclosed herein, one skilled in the art will recognize that any reasonable doping procedure, for example, gas phase doping, liquid phase doping, solid phase doping, plasma doping, and the like may also be used to dope fin structure 1610.

In one embodiment of the invention, nitride etch stop layer 1520 may not be removed until after the doping of the fin structure 1610 is completed, as illustrated in FIG. 17. Following doping, an annealing procedure may be performed to cure crystal defects and internal stresses, and to allow a substantial portions of the implanted dopants to be incorporated into the crystal lattice.

Referring to FIG. 17, fin structure 1610 may correspond to fin 121 in FIG. 5, first oxide layer 1510 may correspond to STI layer 130 in FIG. 5, and N+ SOI may correspond to N+ doped layer 120 in FIG. 5. Forming the PIN diode on the SOI substrate may therefore be continued by following the procedures associated with FIGS. 6-11 described in the previous section. Accordingly, an intrinsic layer may be formed adjacent to the fin structure 1610, and a P+ doped layer may be formed adjacent to the intrinsic layer using the procedures outlined in the previous section to form a PIN diode. Contacts may also be provided to electrically access the P+ and N+ regions according to the procedures described in the previous section.

FIG. 18 is a flow diagram of exemplary operations performed to form a fin structure on an SOI substrate. The operations may begin in step 1802 by providing a SOI substrate. The SOI substrate may comprise an insulator layer disposed on a semiconductor substrate and a semiconductor (SOI) layer disposed on the insulator layer. The semiconductor substrate may correspond to substrate 1310, the insulator layer may correspond to insulator layer 1320, and the SOI layer may correspond to SOI layer 1330, illustrated in FIG. 13.

In step 1804, a pad nitride layer may be formed on top of the SOI layer and an STI layer may be formed on top of portions of the insulator layer not covered by the SOI layer, as illustrated in FIG. 13. The pad nitride layer may correspond to the pad nitride layer 1350 the STI layer may correspond to STI layer 1340, illustrated in FIG. 13. In step 1806 the pad nitride layer may be removed, for example, using a hot phosphoric acid etch. In step 1808, dopants may be implanted into the SOI layer to form a first doped layer, as illustrated in FIG. 14.

In step 1810, a first oxide layer may be disposed on the first doped layer. The first oxide layer may correspond to oxide layer 1510 illustrated in FIG. 15. In step 1812, a first nitride layer may be disposed on the first oxide layer. The first nitride layer may correspond to the nitride etch stop layer 1520 illustrated in FIG. 15.

In step 1814, a second oxide layer may be disposed on the first nitride layer. The second oxide layer may correspond to oxide layer 1530 illustrated in FIG. 15. In step 1816, a second nitride layer may be disposed on the second oxide layer. The second oxide layer may correspond to the nitride polish stop layer 1540 illustrated in FIG. 15.

In step 1818, an aperture may be formed through the second nitride layer, second oxide layer, first nitride layer, and the first oxide layer such that the first doped layer is exposed through the aperture. In step 1820, a fin structure may be formed in the aperture and over the second nitride layer by epitaxial growth, as illustrated in FIG. 16.

In step 1822, the fin structure may be polished down to the second nitride layer. In step 1824, the second nitride layer, the second oxide layer, and the first nitride layer may be removed, thereby exposing the fin structure, as illustrated in FIG. 17. In step 1826, the exposed fin structure may be doped using, for example, a slanted ion implantation procedure, as illustrated in FIG. 17. Subsequently, in step 1828, an annealing procedure may be performed to remove crystal defects and allow integration of the dopants into the crystal lattice.

CONCLUSION

By providing simple and efficient methods for forming a PIN diode compatible with emerging FinFET technology, embodiments of the invention reduce the complexity and cost of developing PIN diodes with large junction areas and high sensitivity.

While the foregoing is directed to embodiments of the present invention, other and further embodiments of the invention may be devised without departing from the basic scope thereof, and the scope thereof is determined by the claims that follow.

What is claimed is:

1. A PIN diode comprising:
    a first doped layer formed on a semiconductor substrate comprising a base portion and a fin structure extending outwards from the base portion;
    a first insulator layer disposed on the base portion of the first doped layer, wherein a portion of the fin structure protrudes through an opening defined in the first insulator layer;
    an intrinsic layer disposed on the portion of the fin structure protruding through the first insulator layer; and
    a second doped layer disposed on the intrinsic layer.

2. The PIN diode of claim 1, wherein the base portion is disposed on a first plane and the fin structure is disposed on a second plane, the second plane being substantially orthogonal with respect to the first plane.

3. The PIN diode of claim 1, wherein the base portion of the first doped layer is disposed on one side of the first insulator layer and the second doped layer is disposed on an opposite side of the first insulator layer.

4. The PIN diode of claim 1, further comprising:
an anti reflective layer disposed adjacent to the second doped layer and the first insulator layer; and
a second insulator layer disposed over the anti reflective layer.

5. The PIN diode of claim 4, wherein the second insulator layer is an oxide layer.

6. The PIN diode of claim 4, further comprising a contact formed through the second insulator layer and the anti reflective layer, wherein the contact is electrically coupled with the second doped layer.

7. The PIN diode of claim 4, further comprising at least one contact formed through the second insulator layer, the anti reflective layer, and the first insulator layer, wherein the at least one contact is electrically coupled with the base portion of the first doped layer.

8. The PIN diode of claim 7, wherein the at least one contact is formed at a predetermined distance radially outwards from a sidewall portion of the fin structure.

9. The PIN diode of claim 1, further comprising:
a semiconductor layer disposed adjacent to the second doped layer and the first insulator layer;
an anti reflective layer disposed adjacent to the semiconductor layer and the first insulator layer; and
a second insulator layer disposed on the anti reflective layer, wherein the semiconductor layer is electrically coupled with the second doped layer.

10. The PIN diode of claim 9, wherein the semiconductor layer is one of a polysilicon layer and an amorphous silicon layer.

11. The PIN diode of claim 9, further comprising at least one contact formed through the second insulator layer and the anti reflective layer, wherein the contact is electrically coupled with the semiconductor layer.

12. A method for manufacturing a PIN diode, comprising:
forming a first doped layer on a semiconductor substrate, the first doped layer having a base portion and a fin structure extending outwards from the base portion;
forming a first insulator layer over the first doped layer so that a first portion of the fin structure is disposed in an opening defined in the first insulator layer and a second portion of the fin structure extends past the opening;
forming an intrinsic layer over the second portion of the fin structure; and
forming a second doped layer over the intrinsic layer.

13. The method of claim 12, wherein the base portion is disposed on a first plane and the fin structure is disposed on a second plane, the second plane being substantially orthogonal with respect to the first plane.

14. The method of claim 12, wherein the base portion of the first doped layer is disposed on one side of the first insulator layer and the second portion of the fin structure is disposed on an opposite side of the first insulator layer.

15. The method of claim 12, wherein forming the base portion and the fin structure comprises doping the semiconductor substrate to form a doped region of a predefined depth along a surface of the semiconductor substrate and etching the doped region to form the base portion and the fin structure.

16. The method of claim 12, wherein forming the first insulator layer comprises performing one of a chemical vapor deposition (CVD) process and a spin on glass (SOG) process to form the insulator layer.

17. The method of claim 12, wherein forming the intrinsic layer comprises epitaxially growing the intrinsic layer adjacent to the portion of the fin structure protruding from the first insulator layer.

18. The method of claim 12, wherein forming the second doped layer comprises epitaxially growing the second doped layer adjacent to the intrinsic layer.

19. The method of claim 12, wherein forming the second doped layer comprises doping an outer region of the intrinsic layer to form the second doped layer.

20. The method of claim 12, further comprising:
forming an anti reflective layer over the second doped layer and the first insulator layer;
forming a second insulator layer over the anti reflective layer;
forming a first contact through the second insulator layer and the anti reflective layer, wherein the first contact is electrically coupled with the second doped layer; and
forming at least one second contact through the second insulator layer, the anti reflective layer, and the first insulator layer, wherein the at least one second contact is electrically coupled with the first doped layer.

21. The method of claim 12, further comprising:
forming a semiconductor layer over the second doped layer and the first insulator layer, wherein the semiconductor layer is electrically coupled with the second doped layer;
forming an anti reflective layer over the semiconductor layer and the first insulator layer;
forming a second insulator layer over of the anti reflective layer;
forming at least one contact through the second insulator layer and the anti reflective layer, wherein the at least one contact is electrically coupled with the semiconductor layer.

* * * * *